US011515815B2

(12) United States Patent
Watkins

(10) Patent No.: US 11,515,815 B2
(45) Date of Patent: Nov. 29, 2022

(54) ACTIVE GATE DRIVER

(71) Applicant: Kabushiki Kaisha Toshiba, Minato-ku (JP)

(72) Inventor: Gavin Tomas Watkins, Bristol (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 231 days.

(21) Appl. No.: 16/912,925

(22) Filed: Jun. 26, 2020

(65) Prior Publication Data
US 2021/0408950 A1 Dec. 30, 2021

(51) Int. Cl.
*H03K 3/00* (2006.01)
*H03K 5/00* (2006.01)
*H03K 17/10* (2006.01)
*H03K 17/687* (2006.01)
*H02P 6/24* (2006.01)
*H03K 17/082* (2006.01)

(52) U.S. Cl.
CPC .......... *H02P 6/24* (2013.01); *H03K 17/0822* (2013.01); *H03K 17/687* (2013.01); *H03K 2217/0072* (2013.01)

(58) Field of Classification Search
None
See application file for complete search history.

(56) References Cited

U.S. PATENT DOCUMENTS

| 4,446,443 | A | * | 5/1984 | Johnson | H03F 1/34 330/265 |
| 5,418,495 | A | * | 5/1995 | Harvey | H03F 3/3066 330/265 |
| 5,973,563 | A | * | 10/1999 | Seven | H03F 1/307 330/268 |
| 8,310,307 | B2 | * | 11/2012 | Kawaguchi | H03F 3/4517 330/265 |
| 8,907,728 | B2 | * | 12/2014 | Watkins | H03F 1/48 330/262 |
| 10,862,437 | B2 | * | 12/2020 | Yoshida | H03F 3/3071 |

FOREIGN PATENT DOCUMENTS

WO   WO 2018/225083 A1   12/2018

OTHER PUBLICATIONS

Miyazaki, K. et al., "General-Purpose Clocked Gate Driver IC With Programmable 63-Level Drivability to Optimize Overshoot and Energy Loss in Switching by a Simulated Annealing Algorithm," IEEE Transactions on Industry Applications, vol. 53, No. 3, May/Jun. 2017, 8 pages.

(Continued)

*Primary Examiner* — Kenneth B Wells
(74) *Attorney, Agent, or Firm* — Oblon, McClelland, Maier & Neustadt, L.L.P.

(57) ABSTRACT

An active gate driver suitable for activating an electronic switch of an electric motor. The active gate driver includes a pull up branch, a pull down branch and a current and voltage feedback from an output of the active gate driver to at least one input of the active gate driver, wherein the current and voltage feedback is common to both the pull up branch and the pull down branch.

17 Claims, 10 Drawing Sheets

(56) References Cited

OTHER PUBLICATIONS

Obara, H. et al., "Active Gate Control in Half-Bridge Inverters Using Programmable Gate Driver ICs to Improve Both Surge Voltage and Converter Efficiency," IEEE Transactions on Industry Applications, vol. 54, No. 5, Sep./Oct. 2018, 9 pages.

Sokolov, A. et al., "Variable-Speed IGBT Gate Driver with Loss/Overshoot Balancing for Switching Loss Reduction," 2014 IEEE Energy Conversion Congress and Exposition (ECCE), 2014, 8 pages.

Soldati, A et al., "A Voltage Controlled Power Resistor Circuit for Active Gate Driving of Wide-bandgap Power Devices," IECON 2015—41st Annual Conference of the IEEE Industrial Electronics Society, Nov. 9-12, 2015, 6 pages.

Wang, X. et al., "Design of an Advanced Programmable Current-Source Gate Driver for Dynamic Control of SiC Device," 2019 IEEE Applied Power Electronics Conference and Exposition (APEC), Mar. 2019, 5 pages.

Zhang, F. et al., "A Novel Active Gate Drive for HV-IGBTs Using Feed-forward Gate Charge Control Strategy," 2015 IEEE Energy Conversion Congress and Exposition (ECCE), Sep. 2015, 6 pages.

Dymond, H. C. P. et al., "A 6.7-GHz Active Gate Driver for GaN FETs to Combat Overshoot, Ringing and EMI," IEEE Transactions on Power Electronics, vol. 33, No. 1, Jan. 2018, 14 pages.

Kawai, S. et al., "A 4.5V/ns Active Slew-Rate-Controlling Gate Driver with Robust Discrete-Time Feedback Technique for 600V Superjunction MOSFETs," 2019 IEEE International Solid-Stage Circuits Conference, 2019, 3 pages.

Krishna, M. V. et al., "Closed loop analog active gate driver for fast switching and active damping of SiC MOSFET," 2018 IEEE Applied Power Electronics Conference and Exposition (APEC), Mar. 2018, 5 pages.

Lobsiger, Y. et al., "Closed-Loop di / dt and dv / dt IGBT Gate Driver," IEEE Transactions on Power Electronics, vol. 30, No. 6, Jun. 2015, 16 pages.

Miyazaki, K. et al., "Gate Waveform Optimization in Emergency Turn-off of IGBT Using Digital Gate Driver," $10^{th}$ International Conference on Power Electrics-ECCE Asia, May 20-30, 2019, 5 pages.

\* cited by examiner

PRIOR ART

PRIOR ART

ACTIVE GATE DRIVER

FIELD

Embodiments described herein relate generally to an active gate driver suitable for activating an electronic switch of an electric motor.

BACKGROUND

Brushless DC (BLDC) motors have been widely adopted for many applications including electric vehicles, industrial cooling and consumer electronics. Brushless DC motors typically comprise a number of magnets on the rotor and a number of electromagnetic coils on the stator. In order to move the rotor the coils are synchronously energised with pulsed waveforms.

For maximum efficiency, the coils should be driven with a sharp pulsed waveform so that the coils are either fully energised or switched off. However, practical coils represent a complex load comprising resistive and inductive elements which combined with stray parasitic components in the printed circuit board (PCB) layout produce resonant circuits. As a result, when a coil is driven by a sharp-pulsed waveform the harmonics of the pulse excite these resonant circuits, resulting in ringing on the current and voltage waveforms. This ringing produces electronic magnetic interference and can prevent a motor from complying with Electromagnetic Compatibility (EMC) regulations.

One way to reduce the effect of this ringing is to increase the amount of metal shielding surrounding the motor; however this is expensive and increases the weight of the motor assembly. In light of this a new approach to controlling a Brushless DC (BLDC) motor is required that is efficient and meets Electromagnetic Compatibility (EMC) regulations.

Arrangements of the embodiments will be understood and appreciated more fully from the following detailed description, made by way of example only and taken in conjunction with drawings in which.

DETAILED DESCRIPTION

Figure 1A:
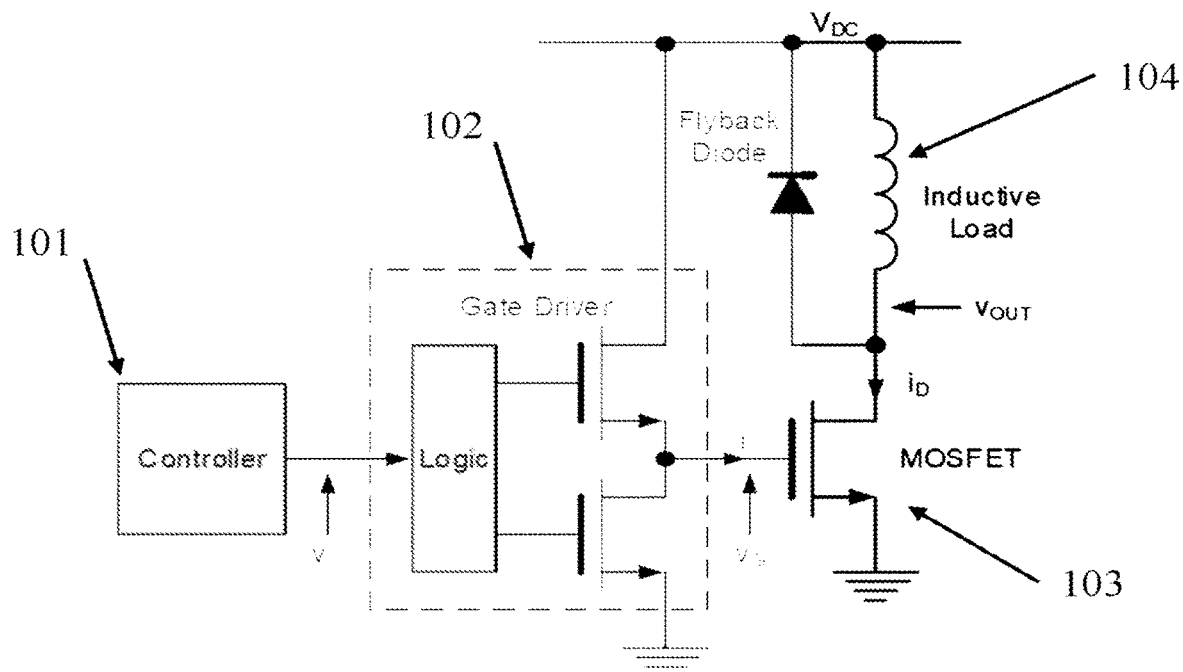
FIG. 1A shows a prior art gate driver circuit.

According to an embodiment there is provided an active gate driver suitable for activating an electronic switch of an electric motor. The active gate driver comprises a pull up branch, a pull down branch and a current and voltage feedback from an output of the active gate driver to at least one input of the active gate driver, wherein the current and voltage feedback is common to both the pull up branch and the pull down branch.

The electronic switch can be configured to control a current flow in a motor winding based on a signal.

In an embodiment at least one of the current feedback and the voltage feedback is a closed loop feedback.

In an embodiment the active gate driver further comprises a biasing circuitry for activating the pull up branch in response to a positive voltage signal and the pull down branch in response to a negative voltage signal.

In an embodiment the biasing circuitry prevents the pull down branch and the pull up branch being activated simultaneously.

In an embodiment the pull up branch comprises a transistor at an output of the pull up branch and the pull down branch comprises a transistor at an output of the pull down branch. The transistor of the pull up branch and the transistor of the pull down branch are connected in series between a first and a second supply voltage. The output of the active gate driver is connected to a node between the transistor of the pull up branch and the transistor of the pull down branch.

In an embodiment the first supply voltage is larger than the second supply voltage.

In an embodiment the active gate driver further comprises an operational amplifier comprising an input. The voltage feedback is from the output of the active gate driver to the input of the operational amplifier. The output out of the active gate driver is connected to a node between the output of the pull up branch and the output of the pull down branch.

In an embodiment the active gate driver further comprises an operational amplifier comprising an input. A current sensing circuitry is configured to sense a current provided at an output of the pull up branch and a current provided at an output of the pull down branch and configured to feed a sensed current back to the input of the operational amplifier.

In an embodiment the operational amplifier comprises first and second inputs. In the embodiment the current feedback is provided to the first input and the voltage feedback is provided to the second input. The first input may be a positive input of the operational amplifier and the second input may be a negative input of the operational amplifier.

The current and voltage feedback may be adaptive or controlled in real time.

In an embodiment the output of the active gate driver is current limited.

In an embodiment at least one of the pull up branch and the pull down branch comprises a current mirror.

In another aspect there is provided an electric motor control system comprising an active gate driver as described herein and a controller. The electric motor control system may comprise a global current feedback from the output of the electronic switch to an input of the controller and the controller may be configured to output a control signal to the input of the active gate driver.

FIG. 1A shows a known gate driver circuit. FIG. 1A shows a gate driver circuit comprising a controller 101, a gate driver 102, an electronic switch 103 and an inductive load 104. In FIG. 1A the electronic switch 103 is a Metal Oxide Semiconductor Field Effect Transistor (MOSFET) and the inductive load 104 represents a motor winding of a Brushless DC motor. In FIG. 1A the input voltage to the electronic switch, $v_G$, can switch between ground and the supply voltage, $V_{DC}$. When the gate voltage, $v_G$, reaches a certain threshold the electronic switch 103 turns on causing a large drain current, $i_D$, to flow and the output voltage, $V_{OUT}$, to drop. Likewise, when the gate voltage, $v_G$, drops below the threshold the electronic switch 103 will turn off.

Figure 1B:
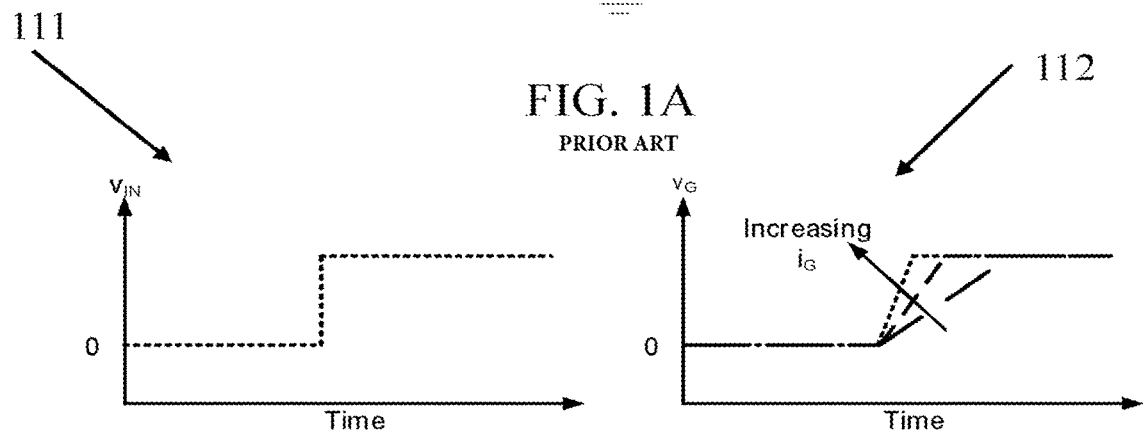
FIG. 1B shows current and voltage waveforms for the prior art gate driver of FIG. 1A.

FIG. 1B shows current and voltage waveforms for the prior art gate driver of FIG. 1A. A first plot 111 of FIG. 1B shows the voltage at the input to the gate driver 102, $v_{IN}$, changing over time as a step-function input signal is outputted by the controller 101. This signal is then transformed by the gate driver 102 into a signal suitable for driving the gate of the MOSFET. The electronic switch 103 will typically be a physically large device and will possess a large capacitance between its gate and its source, $C_{GS}$. Due to the large gate-source capacitance, $C_{GS}$, of the electronic switch 103 it will take a finite amount of time for the gate voltage of the electronic switch 103, $v_G$, to respond to the input signal. The amount of time depends on the available gate current, $i_G$, which may be limited by the gate driver 102. This effect can be seen from a second plot 112 that shows the rise time of the gate voltage, $v_G$, decreasing as the available gate current, $i_G$, increases. Accordingly, this has the effect of reducing the fall time of the output voltage, $V_{OUT}$, as can be seen in a third plot 113.

Delays in the rise and fall times of the output voltage represent a loss of efficiency. Ideally, $V_{OUT}$ should replicate a step function (i.e. rise and fall quickly) for maximum efficiency.

In FIG. 1A the electronic switch 103 controls an inductive load 104. Optionally, the inductive load is a motor winding of a Brushless DC (BLOC) machine. Due to the inductive nature of the load 104 and stray parasitic components of the PCB the drain current, $i_D$, will experience ringing when the electronic switch 103 switches between states. This effect can be seen in a fourth plot 114. The greater the gate current, $i_G$, the quicker the output voltage, vOUT, changes and the larger the amplitude of ringing on the drain current, $i_D$. A varying current flow like this can increase the amount of radiation from the switching circuit. Consequently, the electronic motor control circuit of FIG. 1A contains a trade-off between achieving high efficiency (e.g. by using a sharp-pulse switching waveform) and remaining compliant with Electromagnetic Compatibility (EMC) regulations by limiting the amount of ringing on the drain current.

Figure 2A:
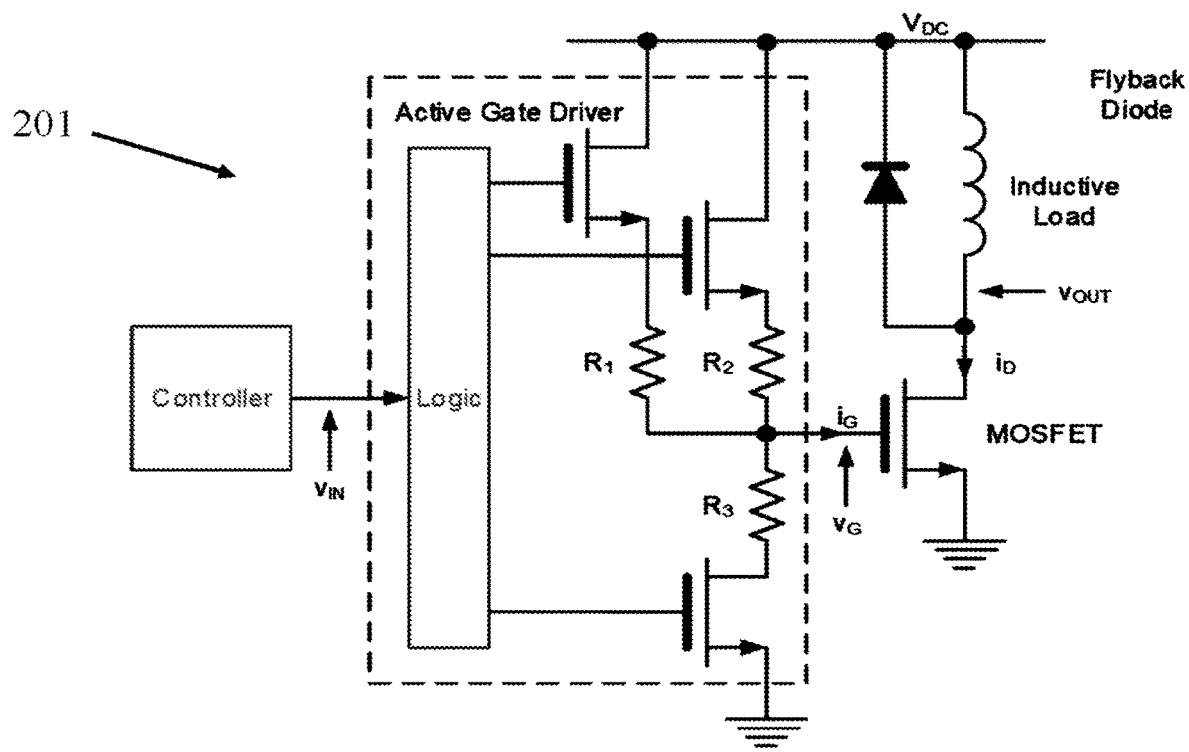
FIG. 2A shows a prior art open loop active gate driver with a switched variable output resistance.

FIG. 2A shows a known open loop active gate driver with a switched variable output resistance. FIG. 2A shows an active gate driver circuit 201 comprising a number of switches connected to the same power supply but with different output resistances. By varying the activated switches in the gate driver circuit 201 it is possible to shape the voltage at the gate of the electronic switch, $v_G$, such that a sharp pulse waveform is avoided.

Figure 2B:
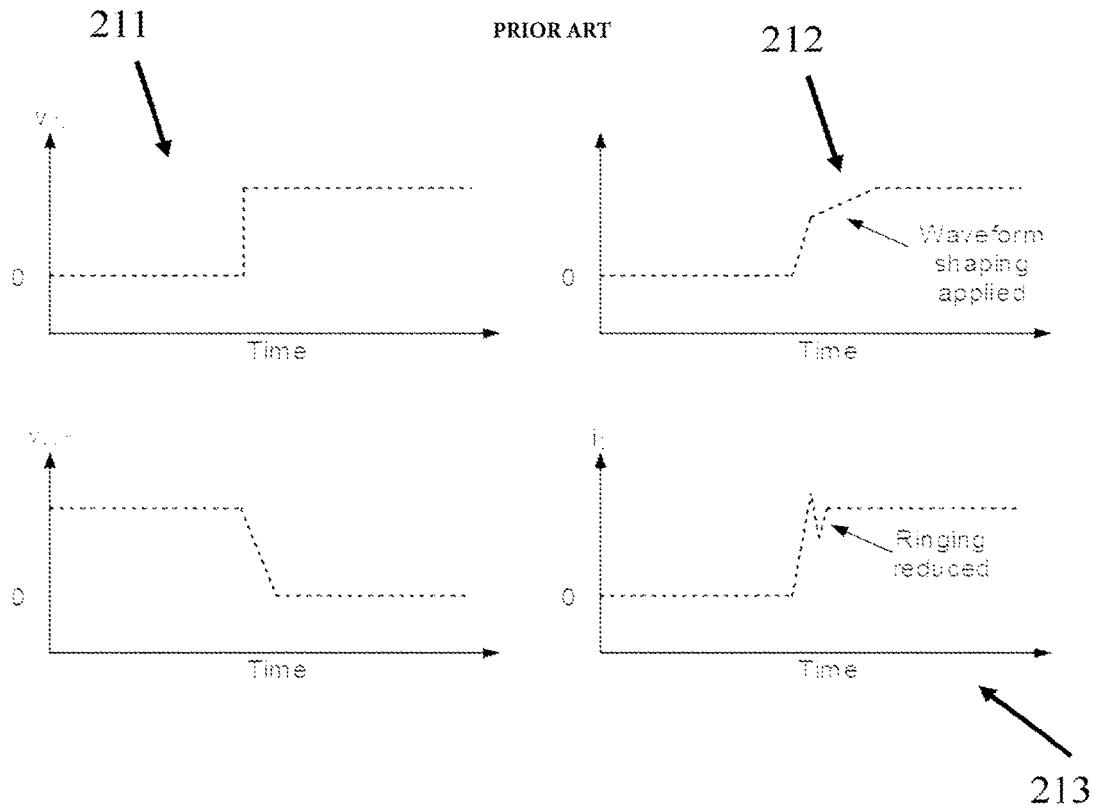
FIG. 2B shows current and voltage waveforms for the prior art gate driver of FIG. 2A.

FIG. 2B shows current and voltage waveforms for the prior art gate driver of FIG. 2A. A first plot 211 of FIG. 2B shows the voltage at the input to the gate driver, $v_{IN}$, changing over time as a step-function input signal is outputted by the controller. A second plot 212 shows a voltage waveform at the gate of the electronic switch, $v_G$, which has been shaped by the gate driver circuit 201. As can be seen from a third plot 213, by shaping the voltage signal applied to the gate of the electronic switch it is possible to reduce the amount of ringing on the drain current, $i_D$.

Pulse shaping using variable output resistance gate driver circuits as shown in FIG. 2A can achieve a reduction in ringing on the drain current, $i_D$, however this is at the expense of complexity. Furthermore, these circuits are hard to optimise and their performance can change in response to variations in: temperature, humidity, supply voltage or mechanical loading of the Brushless DC (BLDC) motor.

Figure 3:
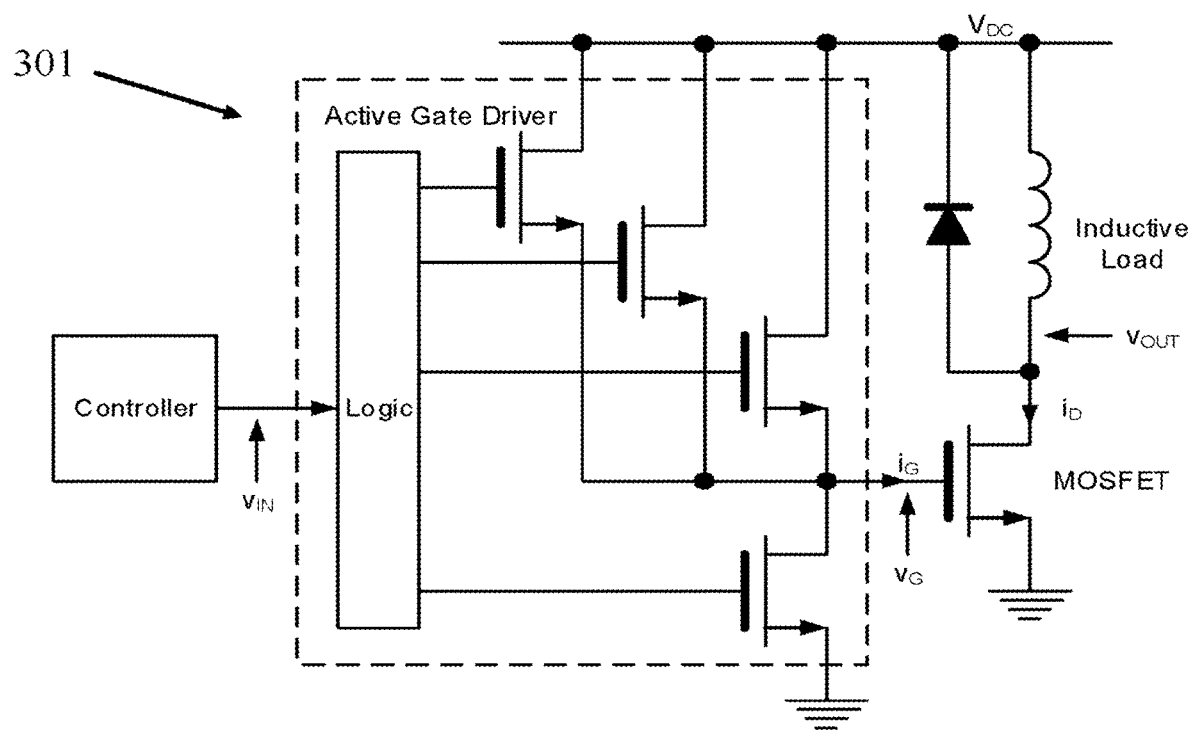
FIG. 3 shows a prior art analogue closed loop active gate driver with transformer feedback.

FIG. 3 shows a known open loop active gate driver that is similar to that of FIG. 2A but uses multiple small MOSFETs in parallel. The small MOSFETs are current limited and act as multiple small switched current sources and sinks. The active gate driver circuit 301 works similarly to that of the active gate driver circuit 201, in that it implements pulse shaping to reduce ringing on the drain current $i_D$.

However, much like the active gate driver circuit 301 of FIG. 2A, these circuits are hard to optimise and their performance can change in response to variations in: temperature, humidity, supply voltage or mechanical loading of the Brushless DC (BLDC) motor. The active gate driver circuit 301 of FIG. 3 and the active gate driver circuit 201 of FIG. 2A trade-off control and complexity. A low number of switches may not provide enough control and a high number of switches can create too many degrees of freedom to calibrate.

Figure 1B:
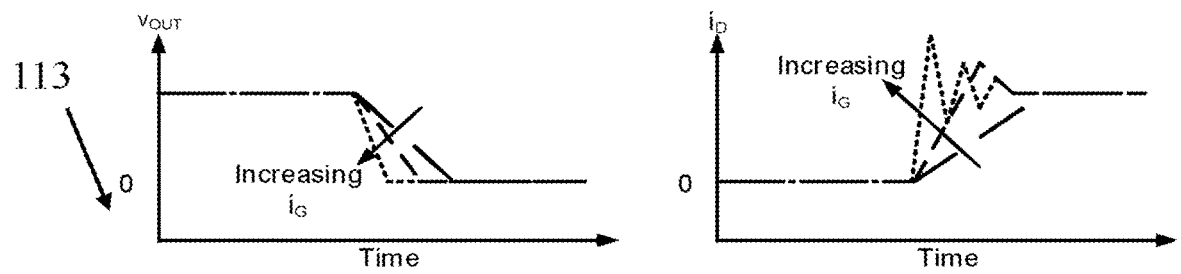
Figure 4:
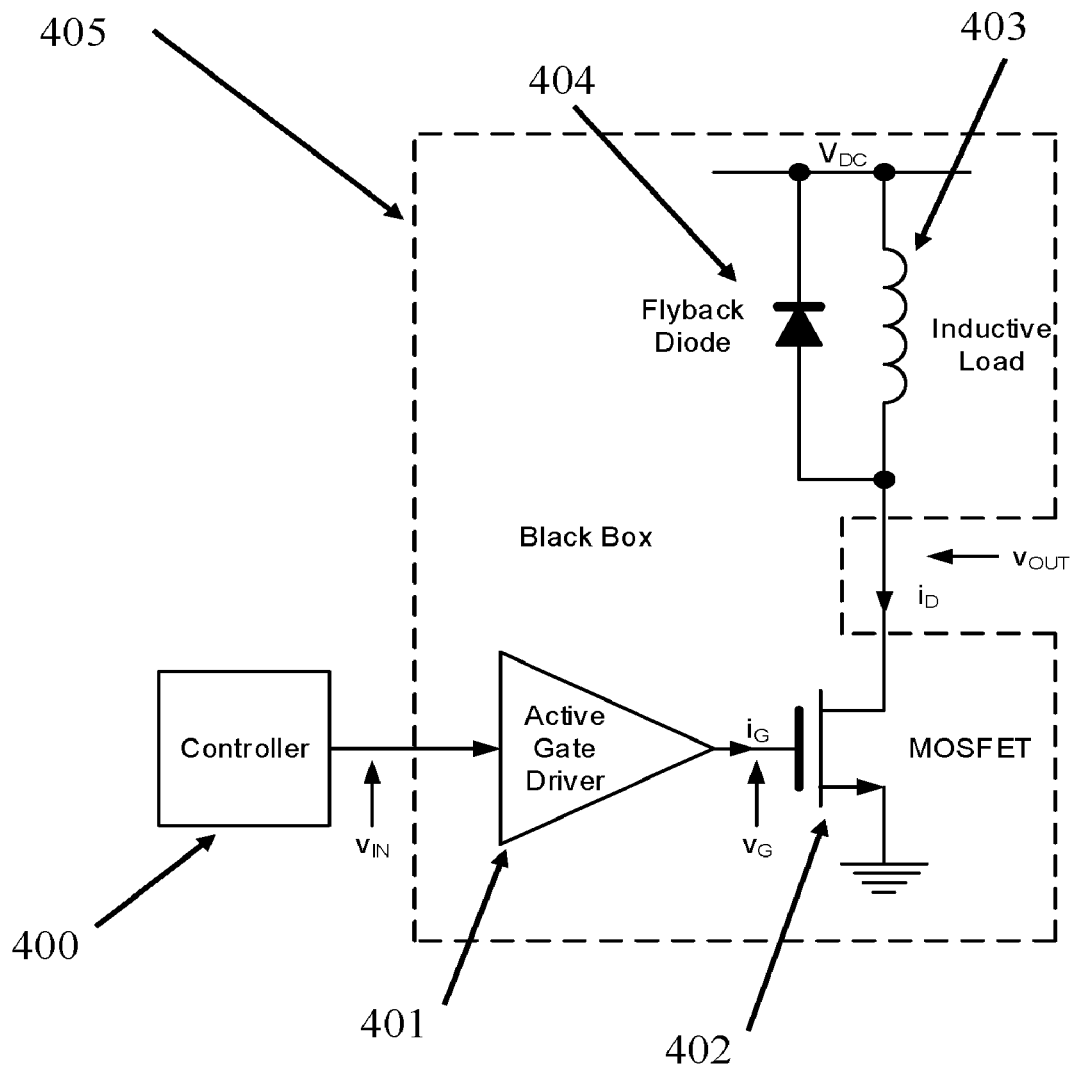
FIG. 4 shows a black box characterisation of an active gate driver, a MOSFET and an inductive load according to an embodiment.

FIG. 4 shows a black box characterisation of an active gate driver, a MOSFET and an inductive load according to an embodiment. FIG. 4 shows a controller 400 that generates a control signal, $v_{in}$. In FIG. 4 the output of the controller 400 is connected to an active gate driver 401. The active gate driver 401 is a power amplifier that accepts a low-power input from the controller 400 and produces a high-current drive output for the gate of a high-power transistor such as an Insulated-gate Bipolar transistors (IGBT) or a Metal Oxide Semiconductor Field Effect Transistor (MOSFET). In FIG. 4 the active gate driver 401 serves as an interface between the controller 400 and an electronic switch 402. The active gate driver 401 could take many forms including that shown in FIG. 1 or a simple on off switch. More complex gate drivers can offer several different output states (such as that shown in FIG. 2).

In FIG. 4 the electronic switch 402 is a Metal Oxide Semiconductor Field Effect Transistor (MOSFET), however other types of switches could also be used (e.g. an Insulated-gate Bipolar transistors (IGBT)).

The electronic switch 402 controls the operation of an inductive load 403. Optionally, a freewheeling diode 404 is connected in parallel across the inductive load 403 to provide a path for the current flowing through the inductive load when the electronic switch 402 switches off.

FIG. 4 shows a black box characterisation 405 of the active gate driver and the MOSFET. The black box characterisation uses the output voltage of the controller 400, $v_{IN}$, as an input and the drain current of the electronic switch 402, $i_D$, as the output of the black box characterisation. In an embodiment the output of the black box characterisation 405 further comprises the output voltage, $v_{OUT}$. By treating the active gate driver as a black box it is possible to create control circuits that are not restricted to use with a particular combination of motor winding and electronic switch.

Figure 5:
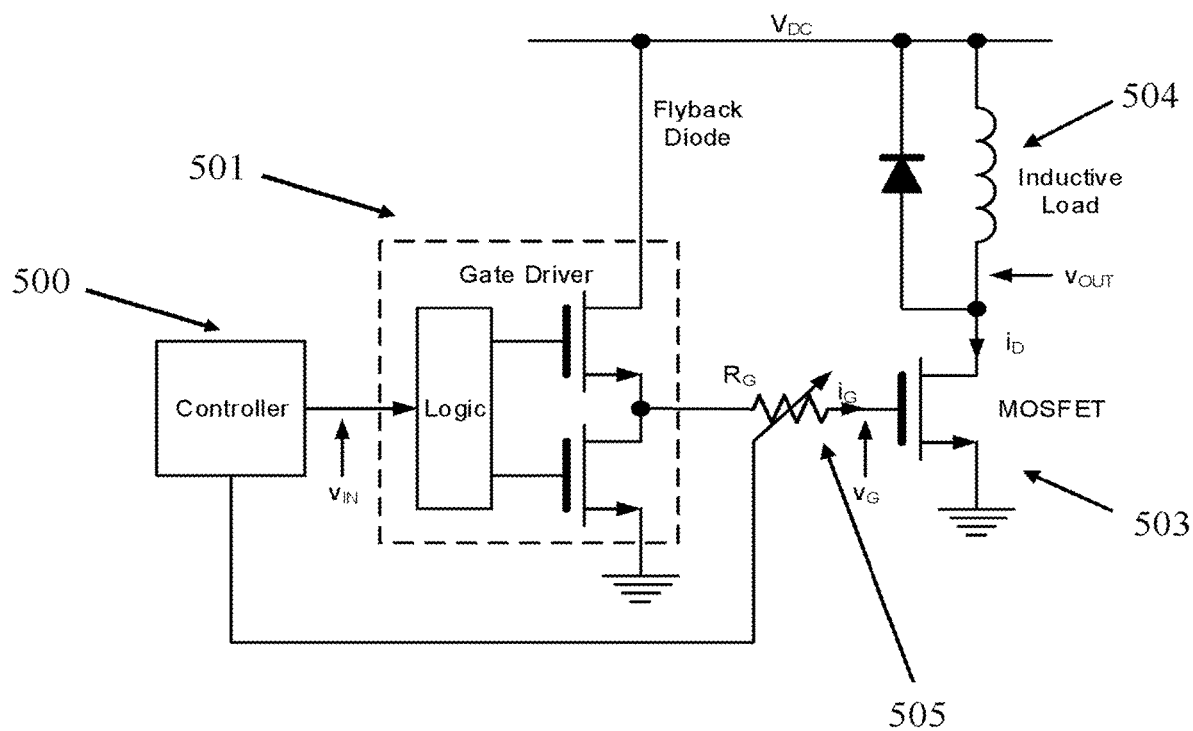
FIG. 5 shows a known gate driver circuit, wherein a variable resistor is placed between the output of the active gate driver and the gate of the MOSFET.

FIG. 5 shows a known gate driver circuit, wherein a variable resistor 505 is placed between the output of the active gate driver 501 and the gate of the MOSFET 503. The variable resistor 505 may be an integrated circuit variable resistor. Integrated circuit variable resistors are low power devices so are unable to supply the large currents needed to switch the MOSFET on quickly.

Figure 6:
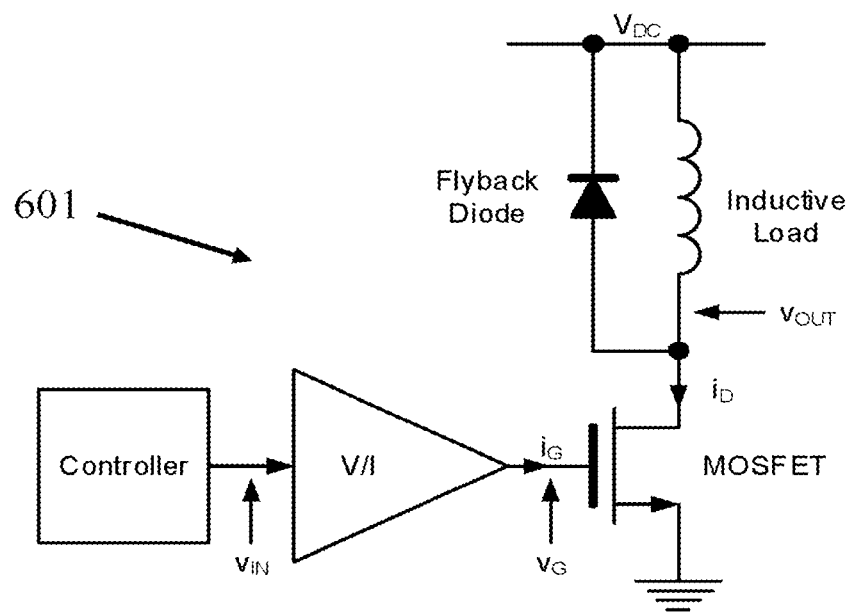
FIG. 6 shows a generalised voltage to current converting active gate driver.
Figure 7:
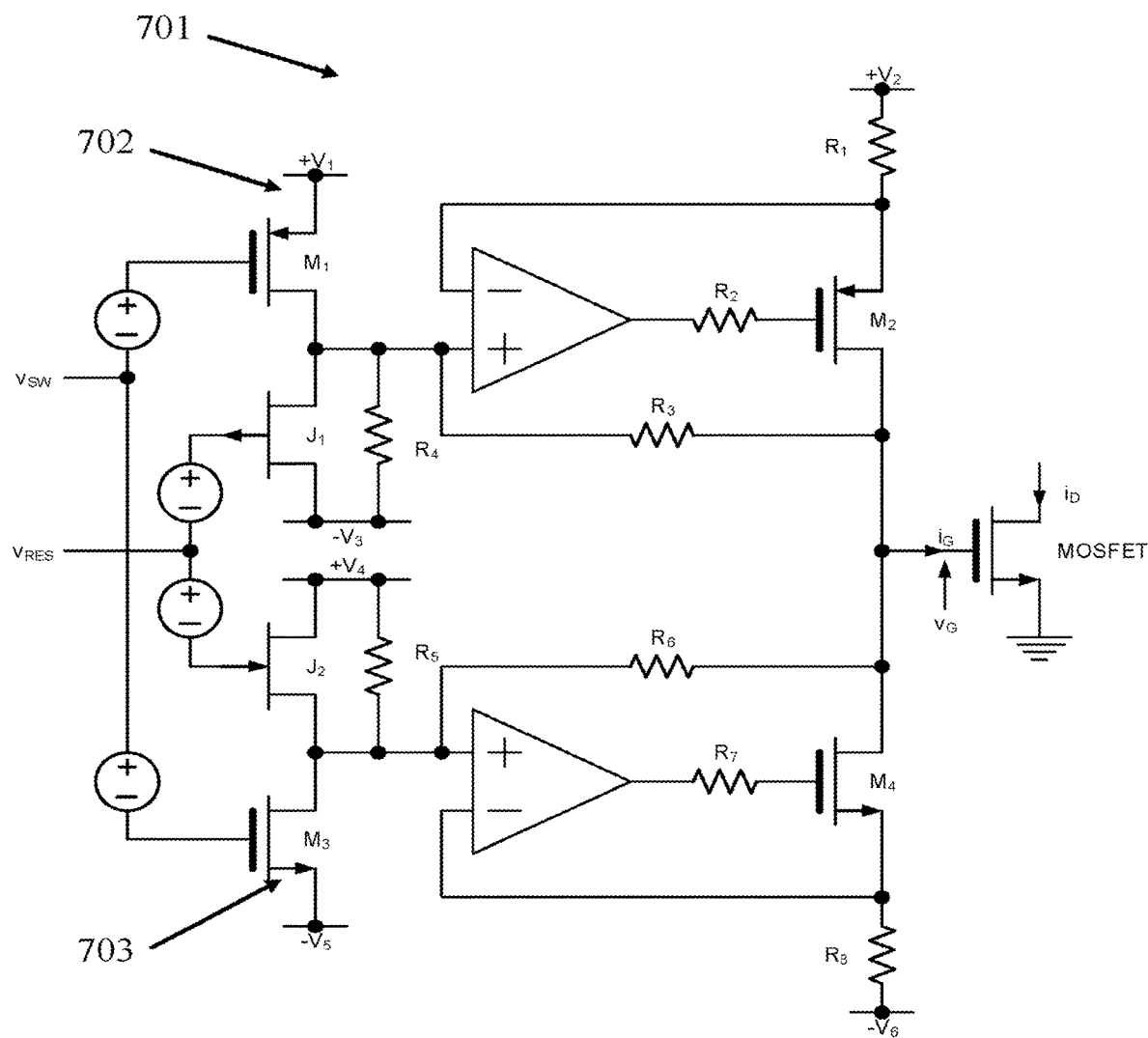
FIG. 7 shows an example of FIG. 6.

FIG. 6 shows a generalised voltage to current converting active gate driver. FIG. 7 shows a known active gate driver that is an example of FIG. 5 and FIG. 6, wherein the active gate driver 701 comprises a current source and current sink with voltage feedback. This may be viewed as a voltage to current converter 601, as shown in FIG. 6. The active gate driver 701 comprises a pull down section activated by a first MOSFET 702 and pull up section activated by a second MOSFET 703.

The active gate driver 701 uses a voltage to current converter at the output stage of the active gate driver 701, which is based around an operational amplifier and a MOSFET, this limits the bandwidth.

The active gate driver 701 comprises a voltage to resistance converter using a junction field effect transistor (JFET). The JFET is open loop and will therefore be susceptible to temperature drift and aging.

The feedback for current and voltage is independent (local) for the pull-up and pull-down sections. Combined with the temperature drift of the JFETs, this can lead to current shoot-through where both pull-up and pull-down section can turn on at the same time and a large current can flow through both sections.

Figure 8A:
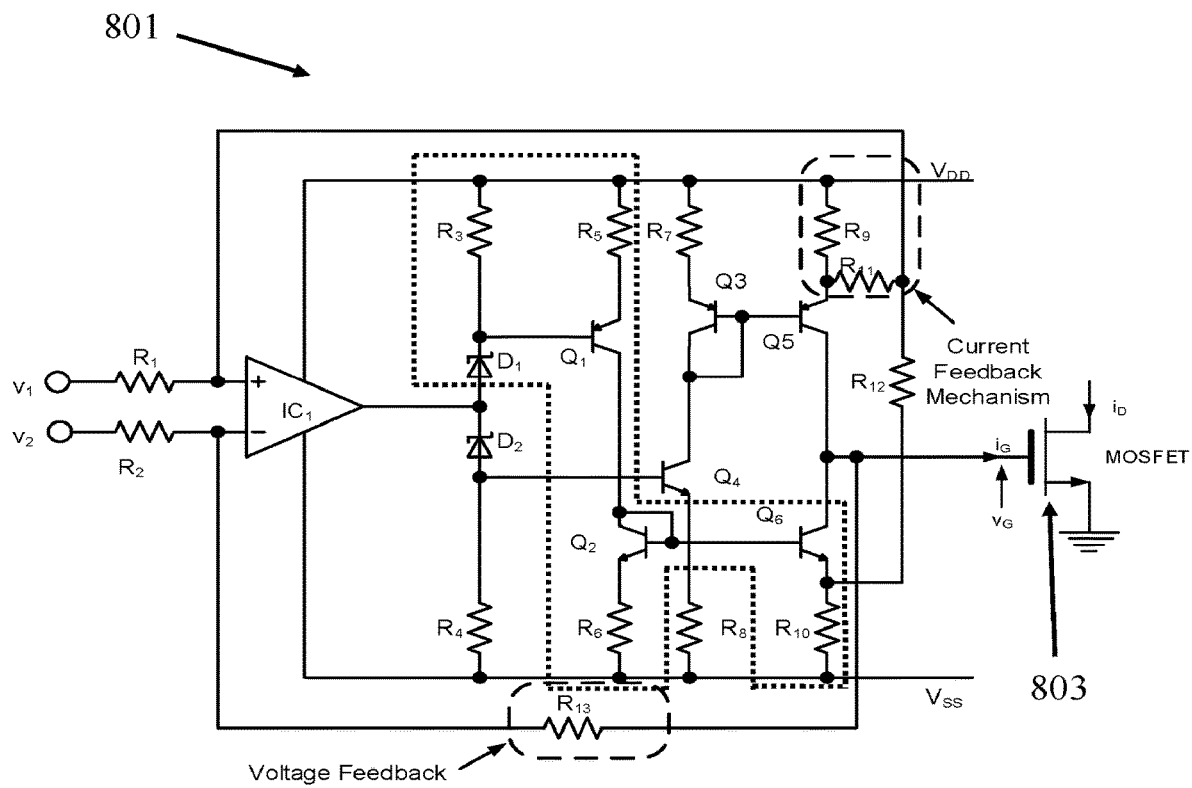
FIG. 8A shows an active gate driver circuit and an electronic switch, wherein a pull down branch is highlighted.
Figure 8B:
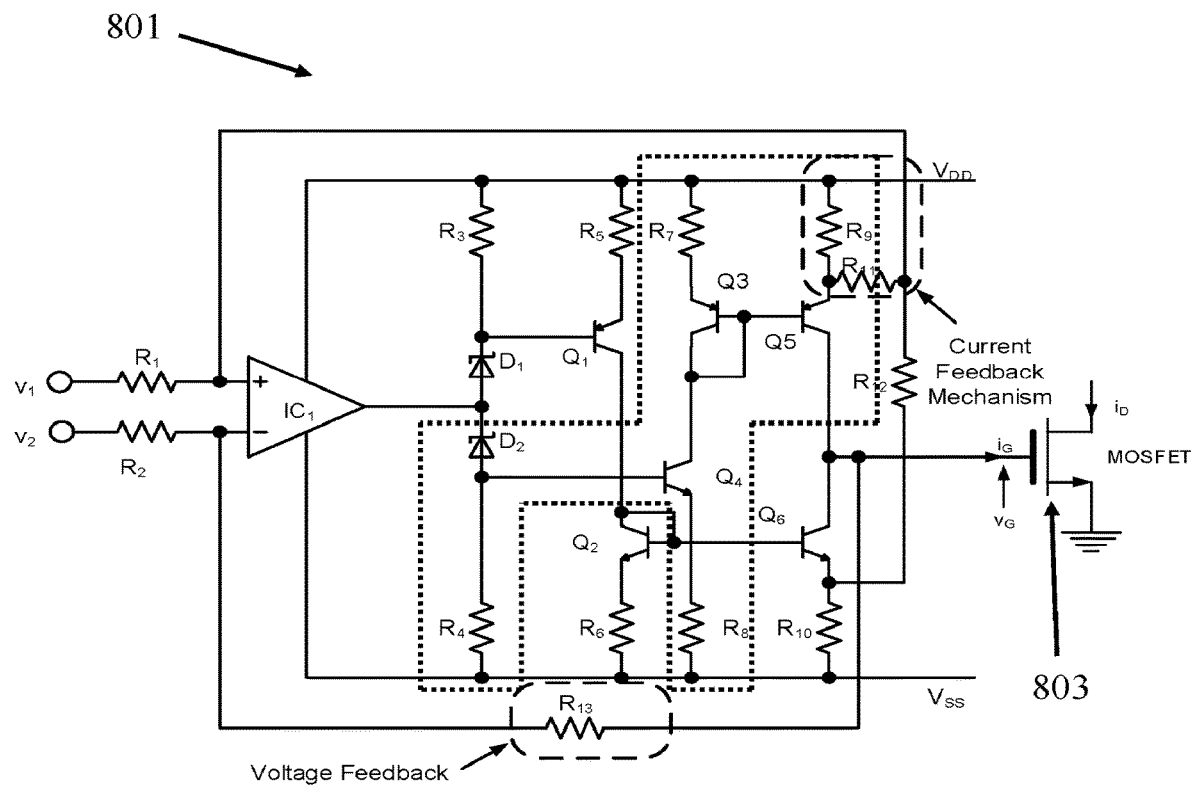
FIG. 8B shows the active gate driver circuit and the electronic switch, wherein a pull up branch is highlighted.

FIG. 8A shows an active gate driver 801 circuit and an electronic switch 803. In FIG. 8A a pull down branch of this circuit is shown in dotted lines. FIG. 8B shows the same active gate driver circuit and the electronic switch 803. In FIG. 8B a pull up branch of this circuit is shown in dotted lines.

The active gate driver circuit comprises an operational amplifier $IC_1$ and the pull down branch and the pull up branch. The active gate driver comprises a voltage and current feedback, wherein the voltage and current feedback is common to both the pull down branch and the pull up branch.

The pull down branch and the pull up branch each comprise a first linear amplifier and a second linear amplifier respectively, wherein the two linear amplifiers each comprise a current mirror. The two current mirrors are a current sinking current mirror and a current sourcing current mirror respectively for the first linear amplifier and the second linear amplifier. The use of current mirrors provide a high full power bandwidth.

The pull down branch is turned on in response to a positive voltage signal and the pull up branch is turned on in response to a negative voltage signal. The active gate driver comprises a biasing circuitry for activating the pull down branch in response to the positive voltage signal and the pull up branch in response to the negative voltage signal.

The pull down branch comprises a pull down resistor that pulls down an output voltage of the pull down branch to a negative supply voltage in response to an output transistor of the current sinking current mirror being switched on. The pull up branch comprises a pull up resistor that pulls up an output voltage of the pull down branch to a positive supply voltage in response to an output transistor of the current sinking current mirror. Due to the inductive nature of the load and stray parasitic components of the PCB the drain current, $i_D$, will experience ringing when the electronic switch 803 switches between states. This effect can be seen in a fourth plot 114 of FIG. 1B. The greater the gate current, $i_G$, the quicker the output voltage, $v_{OUT}$, changes and the larger the amplitude of ringing on the drain current, $i_D$. A varying current flow like this can increase the amount of radiation from the switching circuit. Consequently, the electronic motor control circuit of FIG. 1A contains a trade-off between achieving high efficiency (e.g. by using a sharp-pulse switching waveform) and remaining compliant with Electromagnetic Compatibility (EMC) regulations by limiting the amount of ringing on the drain current.

An input of the electronic switch 803 is driven by the active gate driver circuit. The electronic switch is configured to drive an inductive load. In an embodiment, the inductive load is a motor winding.

The inductive load could also be an inductor or transformer that is part of a switched-mode power supply (SMPS) or a DC-DC converter.

The electronic switch may be a Metal Oxide Semiconductor Field Effect Transistor (MOSFET), Isolated Gate Bipolar Transistor (IGBT) or other semiconductor devices.

Embodiments provide a solution to maintain high efficiency whilst complying with EMC regulations by limiting the amount of ringing on the drain current. The input at the electronic switch 803 can be current limited to reduce ringing; however, this could reduce the switching efficiency of the electronic switch 803. Embodiments adjust the output impedance of the linear amplifiers to reduce ringing whilst maintaining high efficiency. Embodiments adjust the output impedance of the linear amplifiers through voltage and current feedback FIG. 8A shows voltages $v_1$ and $v_2$ as inputs to the non-inverting and inverting inputs of the operational amplifier $IC_1$ respectively. The operational amplifier $IC_1$ is powered by a positive supply voltage $V_{DD}$ and a negative supply voltage $V_{SS}$. An output of the operational amplifier is connected to the pull down branch through a first diode $D_1$ and the pull up branch through a second diode $D_2$.

In FIG. 8A, the pull down branch of the active gate driver 801 is outlined with dotted lines. The pull down branch comprises the first diode $D_1$ and the first linear amplifier comprising a resistor $R_3$, a transistor $Q_1$ and a current sinking current mirror comprising a transistor $Q_2$, a resistor $R_6$, a transistor $Q_6$ and resistor $R_{10}$. Transistor $Q_1$ is a PNP transistor and transistor $Q_2$ and transistor $Q_6$ are NPN transistors. The transistor $Q_6$ is the output transistor of the current sinking current mirror in the pull down branch.

FIG. 8A and FIG. 8B show the transistors as Bipolar Junction Transistors (BJT). Other transistors, such as MOSFETS could be used instead or other device technologies that operate in a similar manner.

The linear amplifiers are activated based on the output of the operational amplifier $IC_1$. The output of the operational amplifier $IC_1$ may be controlled by a controller circuit. The controller circuit may be digital and comprise a digital to analogue converter (DAC) to act as an interface to the active gate driver 801, in particular to the operational amplifier $IC_1$.

When viewed from the output of the operational amplifier $IC_1$, an anode of the first diode $D_1$ is connected in series with the output of the operational amplifier $IC_1$. The cathode of the first diode $D_1$ is connected to the resistor $R_3$ and a base of the transistor $Q_1$, such that the base of the transistor $Q_1$ is connected between the cathode of the first diode $D_1$ and the resistor $R_3$. The resistor $R_3$ is connected to the positive supply voltage $V_{DD}$ such that the resistor $R_3$ is connected between the cathode of the first diode $D_1$ and the positive supply voltage $V_{DD}$.

An emitter of the transistor $Q_1$ is connected to the resistor $R_5$. The resistor $R_5$ is connected to the positive supply voltage $V_{DD}$, such that the resistor $R_5$ is connected between the emitter of the transistor $Q_1$ and the positive supply voltage $V_{DD}$. A collector of the transistor $Q_1$ is connected to the current sinking current mirror. Specifically, the collector of the transistor $Q_1$ is connected to a collector of the transistor $Q_2$.

The collector of the transistor $Q_2$ is connected to a base of the transistor $Q_2$. An emitter of the transistor $Q_2$ is connected to the resistor $R_6$. The resistor $R_6$ is connected to the negative supply voltage $V_{SS}$, such that the resistor $R_6$ is connected between the emitter of the transistor $Q_2$ and the negative supply voltage $V_{SS}$. The base of the transistor $Q_2$ is also connected to a base of the transistor $Q_6$.

An emitter of the transistor $Q_6$ is connected to the resistor $R_{10}$. The resistor $R_{10}$ is connected to the negative supply voltage $V_{SS}$, such that the resistor $R_{10}$ is connected between the emitter of the transistor $Q_6$ and the negative supply voltage $V_{SS}$.

The collector of the transistor $Q_6$ is connected to a gate of the electronic switch 803. A voltage output at the collector of the transistor $Q_6$ is the input to the electronic switch 803, which is depicted as the gate of the MOSFET in FIG. 8A and FIG. 8B.

In FIG. 8B, the pull up branch of the active gate driver 801 is outlined with dotted lines. The pull up branch comprises the second diode $D_2$ and the second linear amplifier comprising a resistor $R_4$, a transistor $Q_4$ and a current sourcing current mirror comprising a transistor $Q_3$, a resistor $R_7$, a transistor $Q_5$, and resistor $R_9$. Transistor $Q_4$ is an NPN transistor and transistor $Q_3$ and transistor $Q_5$ are PNP transistors. The transistor $Q_5$ is the output transistor of the current sourcing current mirror in the pull up branch.

When viewed from the output of the operational amplifier $IC_1$, the cathode of the second diode $D_2$ is connected in series with the output of the operational amplifier $IC_1$. The anode of the second diode $D_2$ is connected to the resistor $R_4$ and a base of the transistor $Q_4$, such that the base of the transistor $Q_4$ is connected between the anode of the second diode $D_2$ and the resistor $R_4$. The resistor $R_4$ is connected to the negative supply voltage $V_{SS}$ such that the resistor $R_4$ is connected between the anode of the second diode $D_2$ and the negative supply voltage $V_{SS}$.

An emitter of the transistor $Q_4$ is connected to the resistor $R_8$. The resistor $R_8$ is connected to the negative supply voltage $V_{SS}$, such that the resistor $R_8$ is connected between the emitter of the transistor $Q_4$ and the negative supply voltage $V_{SS}$. A collector of the transistor $Q_4$ is connected to the current sourcing current mirror. Specifically, the collector of the transistor $Q_4$ is connected to a collector of the transistor $Q_3$.

The collector of the transistor $Q_3$ is connected to a base of the transistor $Q_3$. An emitter of the transistor $Q_3$ is connected to the resistor $R_7$. The resistor $R_7$ is connected to the positive supply voltage $V_{DD}$, such that the resistor $R_7$ is connected between the emitter of the transistor $Q_3$ and the positive supply voltage $V_{DD}$. The base of the transistor $Q_3$ is also connected to a base of the transistor $Q_5$.

An emitter of the transistor $Q_5$ is connected to the resistor $R_9$. The resistor $R_9$ is connected to the positive supply voltage $V_{DD}$, such that the resistor $R_9$ is connected between the emitter of the transistor $Q_5$ and the positive supply voltage $V_{DD}$.

The active gate driver 801 comprises a synthetic output impedance. The synthetic output impedance comprises a resistor $R_{11}$, $R_{12}$ and $R_{13}$. The synthetic output impedance is provided by voltage and current feedback.

The resistor $R_{13}$ provides the voltage feedback from the output of the active gate driver 801 to an input of the active gate driver 801. The input of the active gate driver 801 is an input of the operational amplifier $IC_1$, wherein the input of the operational amplifier comprises a non-inverting input and an inverting input.

Specifically, the collector of the transistor $Q_6$ is connected to the resistor $R_{13}$. The resistor $R_{13}$ is connected to the inverting input of the operational amplifier $IC_1$ and a resistor $R_2$ is connected to the inverting input of the operational amplifier $IC_1$, such that the resistor $R_{13}$ is connected between the emitter of the transistor $Q_6$ and a node between the resistor $R_2$ and the inverting input of the operational amplifier $IC_1$ to form a potential divider with resistor $R_{13}$ and $R_2$. The resistor $R_{13}$ forms a potential divider with resistor $R_2$ provides voltage feedback from the collector of the transistor $Q_6$ to the inverting input of the operational amplifier $IC_1$.

Resistor $R_{11}$ and resistor $R_{12}$ respectively form a potential divider with resistor $R_1$ connected to the non-inverting input of $IC_1$ and provide feedback of the current flowing through $Q_5$ and $Q_6$ respectively. $R_9$ and $R_{10}$ are low value resistors that may, for example, have a value in the range of 1-10 Ohms to allow for large currents to flow through $Q_5$ and $Q_6$ respectively. $R_{11}$ and $R_{12}$ in contrast are identical value higher value resistors that serve to sense the current flowing through $Q_5$ and $Q_6$ respectively.

The voltage and current feedback of the active gate driver 801 of embodiments is closed loop. This avoids problems with susceptibility to temperature and aging effects found in known active gate drivers.

In an embodiment, the resistors $R_5$ $R_6$ $R_7$ $R_8$ $R_9$ and $R_{10}$ have a relationship, which can be expressed using the equation below.

$$R_5 = R_6 = R_7 = R_8 = R_9 = R_{10}$$

Moreover, $R_{11}$ and $R_{12}$ may have the following relationship in the embodiment.

$$R_{11} = R_{12}$$

Accordingly, the equation for the output of the active gate driver $i_G$ is derived to be the following:

$$i_G = \frac{\left(2 + \frac{R_{12}}{R_1}\right)}{\left(1 + \frac{R_{13}}{R_2}\right)}\left(v_G + \frac{R_{13}}{R_2}v_2\right) - \frac{R_{12}}{R_1}v_1$$

The coefficients of $v_G$, $v_2$ and $v_1$ can be simplified with substitution to:

$$i_G = Av_G + Bv_2 - Cv_1$$

By manipulating both $v_2$ and $v_1$, $Z_{OUT}$ ($v_G/i_G$) can be manipulated. If either $v_1$ or $v_2$ is grounded so that their value is zero, the other exclusively controls $Z_{OUT}$. Similarly, either $R_1$ or $R_2$ can be an open circuit (high impedance) so that either $v_2$ or $v_1$ respectively has exclusive control over $Z_{OUT}$.

In another example different resistance values may be adopted. For example, $R_7$ and $R_8$ may have a value that is ten times the value of $R_9$ and $R_{10}$, while $R_5$ and $R_6$ can be five times as large as $R_7$ and $R_8$.

Figure 9:
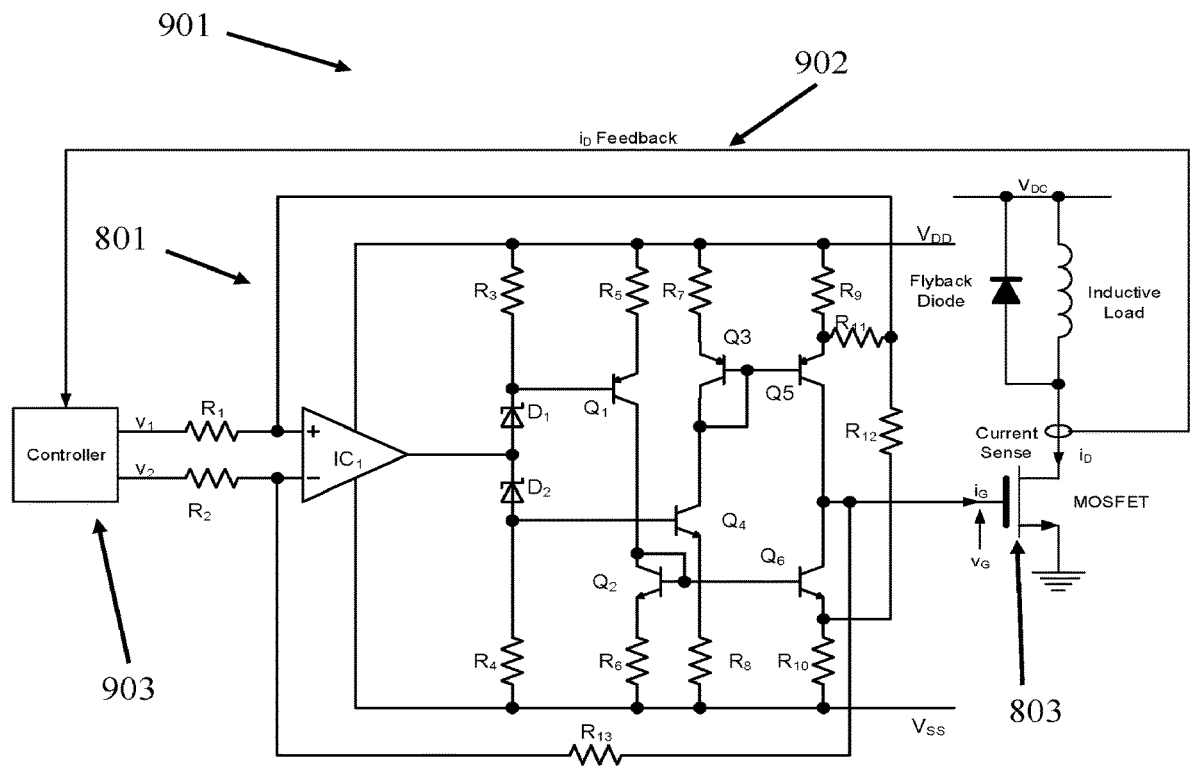
FIG. 9 shows an electric motor control system comprising the active gate driver, wherein the electric motor control system comprises a global current feedback.

FIG. 9 shows an electric motor control system 901 comprising the active gate driver 801, wherein the electric motor control system 901 comprises a global current feedback 902. The global current feedback is from the output of the electronic switch to a controller 903.

The global feedback mechanism further ensures that the system is not affected by variations such as temperature, aging, humidity, supply voltage and mechanical load.

The voltage and current feedback may be in real time or adaptive. Where the voltage and current feedback is adaptive, an adaption algorithm may be implemented by the controller or an external adaption algorithm block, wherein the adaptation algorithm generates filter tap coefficients, otherwise known as gain weightings, which improve switching characteristics. In an embodiment, the adaption algorithm is based on any optimisation method including, but not limited to, a generic algorithm (GA) or a mean square error (MSE) optimisation.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. An active gate driver comprising:
a pull up branch;
a pull down branch;
a first connection between a first input of the active gate driver and an output of the pull up branch and the pull down branch; and
a second connection between a second input of the active gate driver and the output of the pull up branch and the pull down branch,
wherein a current and voltage feedback is performed via the first connection and the second connection, the feedback being performed from an output of the active gate driver to the first input and the second input of the active gate driver.

2. The active gate driver according to claim 1 wherein the active gate driver further comprises biasing circuitry configured to activate the pull up branch in response to a positive voltage signal and the pull down branch in response to a negative voltage signal.

3. The active gate driver according to claim 1 wherein the pull up branch comprises a transistor at an output of the pull up branch and the pull down branch comprises a transistor at an output of the pull down branch, wherein the transistor of the pull up branch and the transistor of the pull down branch are configured to be connected in series between a first and a second supply voltage and wherein the output of the active gate driver is configured to be connected to a node between the transistor of the pull up branch and the transistor of the pull down branch.

4. The active gate driver according to claim 1 wherein the active gate driver further comprises an operational amplifier comprising the first input and the second input, wherein the voltage feedback is from the output of the active gate driver to the first input and the second input, and the output of the active gate driver is configured to be connected to a node between the output of the pull up branch and the output of the pull down branch.

5. The active gate driver according to claim 1 wherein the active gate driver further comprises an operational amplifier comprising the first input and the second input, and the active gate driver further comprises current sensing circuitry configured to sense a current provided at an output of the pull up branch and a current provided at an output of the pull down branch and configured to feed a sensed current back to the first input and the second input.

6. The active gate driver according to claim 1 wherein the current and voltage feedback is adaptive or controlled in real time.

7. The active gate driver according to claim 1 wherein the output of the active gate driver is current limited.

8. The active gate driver according to claim 1 wherein at least one of the pull up branch and the pull down branch comprises a current mirror.

9. An electric motor control system, comprising:
an active gate driver comprising:
a pull up branch; and
a pull down branch,
wherein a current and voltage feedback is performed from an output of the active gate driver to at least one input of the active gate driver, wherein a path of the current and voltage feedback is connected, directly or indirectly, to circuit elements of the pull up branch and the pull down branch; and
a controller,
wherein the electric motor control system is configured to perform a current feedback from an output of an electronic switch of the electric motor to an input of the controller and the controller is configured to output a control signal to the input of the active gate driver.

10. An electric motor control system, comprising:
an active gate driver comprising:
a pull up branch;
a pull down branch;
a first connection between a first input of the active gate driver and an output of the pull up branch and the pull down branch;
a second connection between a second input of the active gate driver and the output of the pull up branch and the pull down branch; and
a controller, wherein
the electric motor control system comprises current feedback circuitry to perform feedback from an output of an electronic switch of the electric motor to an input of the controller and the controller is configured to output a control signal to the first input and the second input of the active gate driver,
a current and voltage feedback is performed via the first connection and the second connection, the feedback being performed from an output of the active gate driver to the first input of the active gate driver and the second input of the active gate driver, and
a path of the current and voltage feedback is connected, directly or indirectly, to circuit elements of the pull up branch and the pull down branch.

11. The electric motor control system according to claim 10 wherein the active gate driver further comprises biasing circuitry configured to activate the pull up branch in response to a positive voltage signal and the pull down branch in response to a negative voltage signal.

12. The electric motor control system according to claim 10 wherein the pull up branch comprises a transistor at an output of the pull up branch and the pull down branch comprises a transistor at an output of the pull down branch, wherein the transistor of the pull up branch and the transistor of the pull down branch are configured to be connected in series between a first and a second supply voltage and wherein the output of the active gate driver is configured to be connected to a node between the transistor of the pull up branch and the transistor of the pull down branch.

13. The electric motor control system according to claim 10 wherein the active gate driver further comprises an operational amplifier comprising the first input and the second input, wherein the current and voltage feedback is from the output of the active gate driver to the first input and the second input, and the output of the active gate driver is configured to be connected to a node between the output of the pull up branch and the output of the pull down branch.

14. The electric motor control system according to claim 10 wherein the active gate driver further comprises an operational amplifier comprising the first input and the second input, and the active gate driver further comprises current sensing circuitry configured to sense a current provided at an output of the pull up branch and a current provided at an output of the pull down branch and configured to feed a sensed current back to the first input and the second input.

15. The electric motor control system according to claim 10 wherein the current and voltage feedback is adaptive or controlled in real time.

16. The electric motor control system according to claim 10 wherein the output of the active gate driver is current limited.

17. The electric motor control system according to claim 10 wherein at least one of the pull up branch or the pull down branch comprises a current mirror.

\* \* \* \* \*